United States Patent [19]
Uchida

[11] Patent Number: 5,240,588
[45] Date of Patent: Aug. 31, 1993

[54] METHOD FOR ELECTROPLATING THE LEAD PINS OF A SEMICONDUCTOR DEVICE PIN GRID ARRAY PACKAGE

[75] Inventor: Hiroyuki Uchida, Tokyo, Japan

[73] Assignee: NEC Corporation, Tokyo, Japan

[21] Appl. No.: 936,271

[22] Filed: Aug. 27, 1992

[30] Foreign Application Priority Data

Aug. 27, 1991 [JP] Japan .................. 3-214917

[51] Int. Cl.⁵ ............ H01L 21/60; C25D 17/06; C25D 5/02
[52] U.S. Cl. .................. 205/125; 205/123; 437/218
[58] Field of Search ............. 205/125, 123; 437/215, 437/218, 228, 246

[56] References Cited

U.S. PATENT DOCUMENTS

| | | | |
|---|---|---|---|
| 4,622,106 | 11/1986 | Kitagawa | 205/125 |
| 5,022,976 | 6/1991 | Röll et al. | 204/297 R |
| 5,087,331 | 2/1992 | Röll et al. | 205/122 |

FOREIGN PATENT DOCUMENTS

| | | | |
|---|---|---|---|
| 62-113457 | 5/1987 | Japan | 437/215 |
| 1-214150 | 8/1989 | Japan | 437/218 |

*Primary Examiner*—Olik Chaudhuri
*Assistant Examiner*—David E. Graybill

[57] ABSTRACT

A method for manufacturing a pin grid array type semiconductor device package including a substrate having a principle surface and a bottom surface opposing the principal surface, a plurality of patterned metallized conductors formed in the substrate or on the principal surface of the substrate so as to be electrically connected to a semiconductor device chip to be located on the principal surface. A plurality of metallized pads are formed on the bottom surface and electrically connected to the patterned metallized conductors. A metal film is deposited so as to cover the bottom surface including the metallized pads, and a lead pin is soldered on the metal film above each metallized pad by a solder material. The lead pin is electroplated by applying a voltage to the metal film.

5 Claims, 4 Drawing Sheets

METHOD FOR ELECTROPLATING THE LEAD PINS OF A SEMICONDUCTOR DEVICE PIN GRID ARRAY PACKAGE

BACKGROUND OF THE INVENTION

1. Field of the Invention

The present invention relates to a method for manufacturing a semiconductor device package and a semiconductor device package manufactured thereby, and more specifically to a method for manufacturing a PGA (pin grid array) type semiconductor device package, and a PGA type semiconductor device package manufactured thereby.

2. Description of Related Art

Conventional PGA type semiconductor device packages include a ceramic substrate having an upper surface and a bottom surface. A recess for supporting a semiconductor chip is defined at a center region of the upper surface of the ceramic substrate, and a plurality of patterned metallized conductors are formed in the inside of the ceramic substrate to extend from a periphery of the recess to a side surface of the ceramic substrate. On the other hand, a plurality of metallized pads are formed on the bottom surface of the ceramic substrate. Each of the metallized pads is electrically connected through a conducting through hole formed in the ceramic substrate, to a land formed in a middle portion of a corresponding patterned metallized conductor.

In addition, the ceramic substrate has an electroplating electrode provided on the side surface of the ceramic substrate so that the patterned metallized conductors are electrically connected to at their outer end (substrate side surface end) of the electroplating electrode. In this condition, the patterned metallized conductors electrically short-circuited to the electroplating electrode are electrically connected to one another. An extension from the land of each patterned metallized conductor to an outer end of the patterned metallized conductor electrically connected to the electroplating electrode can be called a "plating lead wire".

Now, a process for manufacturing a semiconductor device package by using the above mentioned ceramic substrate will be described. However, a manufactured process portion having no direct relation to the present invention will be omitted for simplification of explanation, and therefore, a process after a sintering process will be described in the following.

Firstly, by applying a voltage to the electroplating electrode formed on the side surface of the ceramic substrate so that the voltage is applied to all the metallized pads through the corresponding "plating lead wires" and the corresponding conducting through holes, nickel is deposited on each of the metallized pads by means of an electroplating. Then, a lead pin is bonded to each nickel-plated metallized pad by a silver/copper solder material, so that a plurality of lead pins soldered to the metallized pads on the bottom surface of the ceramic substrate stand perpendicularly to the bottom surface of the ceramic substrate. Thereafter, nickel/cobalt alloy and gold are deposited by means of an electroplating. Finally, the electroplating electrode is removed by means of grinding, so that the patterned metallized conductors are electrically and mechanically separated from one another. Thus, a PGA type semiconductor device package is completed.

In the semiconductor device package manufactured by the above mentioned process using the above mentioned ceramic substrate, each patterned metallized conductor extends to the side surface of the ceramic substrate so as to form a "plating lead wire" connected to the electroplating electrode provided on the side surface of the ceramic substrate, so that the electroplating is performed by applying a voltage through the electroplating electrode and the "plating lead wire". However, the "plating lead wire", which is an extension from the land of each patterned metallized conductor, will increase a stray capacity between wiring conductors. This becomes a cause for a signal crosstalk or a noise generation in a high frequency operation of the integrated circuit. Namely, the characteristics of the semiconductor integrated circuit is deteriorated.

SUMMARY OF THE INVENTION

Accordingly, it is an object of the present invention to provide a method for manufacturing a PGA type semiconductor device package, and a PGA type semiconductor device package manufactured thereby, which has overcome the above mentioned defect of the conventional one.

Another object of the present invention is to provide a method for manufacturing a PGA type semiconductor device package having a reduced stray capacity between wiring conductors, and a PGA type semiconductor device package manufactured thereby having a reduced stray capacity between wiring conductors.

The above and other objects of the present invention are achieved in accordance with the present invention by a method for manufacturing a pin grid array type semiconductor device package which includes a substrate having a principal surface and a bottom surface opposing the principal surface, the principal surface having a region on which a semiconductor device chip is to be mounted, a plurality of patterned metallized conductors formed in the substrate or on the principal surface of the substrate so as to be electrically connected to the semiconductor device chip, a plurality of metallized pads formed on the bottom surface and electrically connected to the patterned metallized conductors, the method including the step of depositing a metal film so as to cover the bottom surface including the metallized pads, fixing a lead pin on the metal film above each of the metallized pads, and electroplating the lead pin by applying a voltage to the metal film.

In a preferred embodiment, before the fixing of the lead pin, a glass film is deposited on the metal film excluding regions above the metallized pads and a corner of the substrate, and the lead pin is fixed on the metal film uncovered by the glass film.

The application of the voltage is performed by applying a voltage to the metal film uncovered by the glass film in the corner of the substrate.

The lead pin is fixed by soldering the lead pin to the metal film uncovered by the glass film and positioned on each metallized pad, by applying a solder material, and the electroplating includes an electroplating of a first metal film on the lead pin and the solder material applied to the lead pin, and an electroplating of a second metal film of gold on the first metal film.

In addition, after the electroplating, by using the second metal film of gold as a protection film, the glass film is removed by hydrofluoric acid, and then the metal film is removed by a dilute hydrochloric acid.

According to another aspect of the present invention, there is provided a pin grid array type semiconductor device package which includes a substrate having a principal surface and a bottom surface opposing the principal surface, the principal surface having a region on which a semiconductor device chip is to be mounted, a plurality of patterned metallized conductors formed in the substrate or on the principal surface of the substrate so as to be electrically connected to the semiconductor device chip, a plurality of metallized pads formed on the bottom surface and electrically connected to the patterned metallized conductors, and a corresponding number of lead pins bonded to the plurality of metallized pads, respectively, the plurality of patterned metallized conductors being formed to terminate at a substantial distance before a side surface of the substrate.

The above and other objects, features and advantages of the present invention will be apparent from the following description of preferred embodiments of the invention with reference to the accompanying drawings.

DESCRIPTION OF THE PREFERRED EMBODIMENTS

Figure 1:
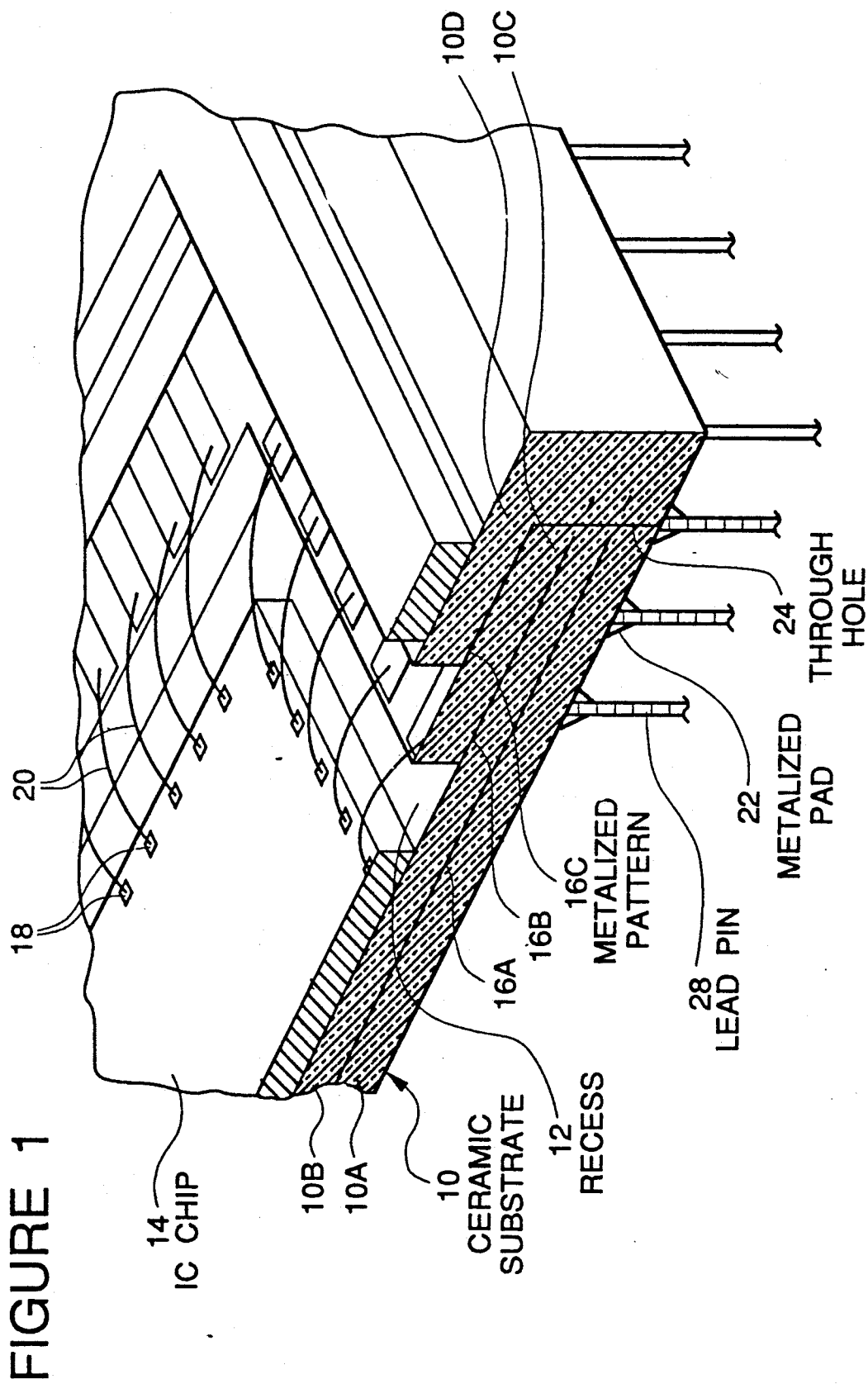
FIG. 1 is a cut-away partial perspective view of one embodiment of the PGA type semiconductor device package in accordance with the present invention.

Referring to FIG. 1, there is shown a cut-away partial perspective view of one embodiment of the PGA type semiconductor device package in accordance with the present invention.

The shown PGA type semiconductor device package includes a ceramic substrate 10 formed of a plurality of stacked ceramic plates 10A, 10B, 10C and 10D. On an upper surface of the ceramic substrate 10, a recess 12 for supporting a semiconductor chip 14 is defined at a center region of the upper surface, and a plurality of patterned metallized conductors are formed in the inside of the ceramic substrate 10. For example, a first level patterned metallized conductor(s) 16A is formed between the stacked ceramic plates 10A and 10B, and a second level patterned metallized conductor(s) 16B is formed between the stacked ceramic plates 10B and 10C. Third level patterned metallized conductors 16C are formed between the stacked ceramic plates 10C and 10D. In the shown embodiment, the third level patterned metallized conductors 16C are exposed on an inside peripheral portion of the ceramic plate 10C, and connected to connection pads 18 of the chip 12 through bonding wires 20.

Figure 2:
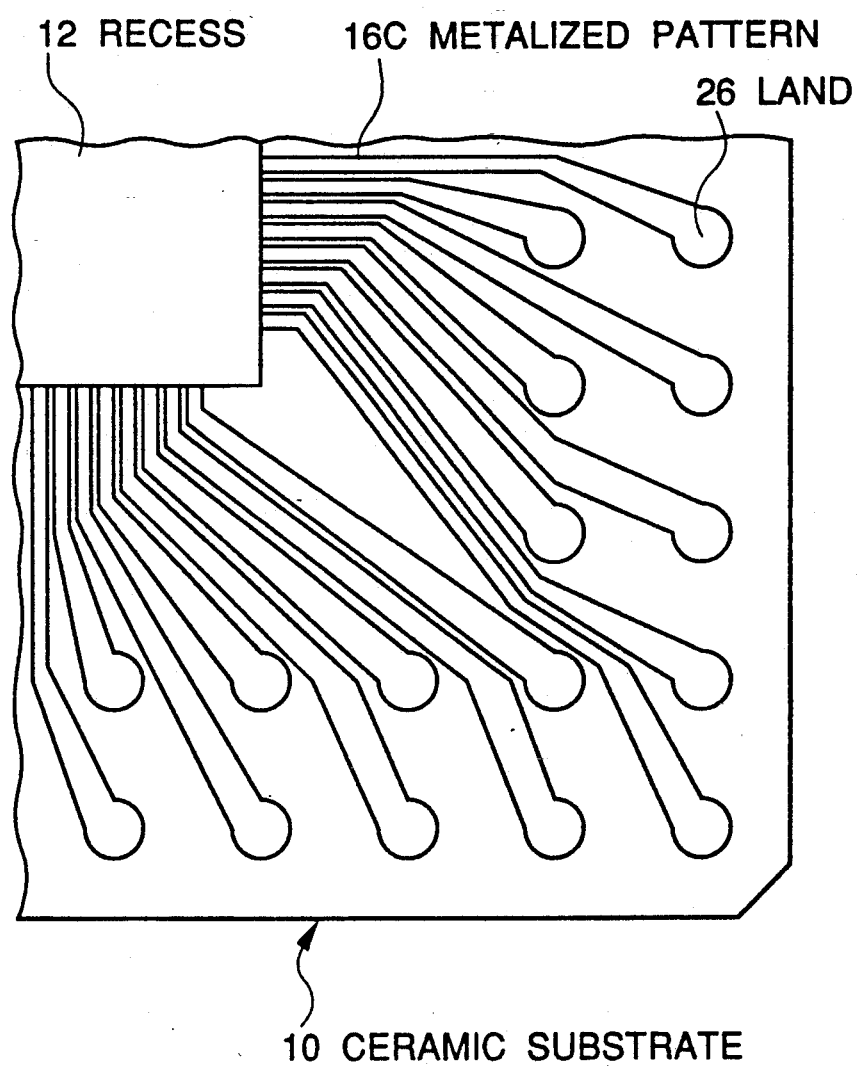
FIG. 2 is a diagrammatic plan view partially showing a metallized pattern formed in the PGA type semiconductor device package in accordance with the present invention.

On the other hand, a plurality of metallized pads 22 are formed on a bottom surface of the ceramic substrate 10 (namely, the ceramic plate 10A). Each of the metallized pads 22 is electrically connected through a conducting through hole 24 formed in the ceramic substrate 10, to a land 26 formed in a tip or outer end of a corresponding patterned metallized conductor as shown in FIG. 2. In addition, a plurality of lead pins 28 are soldered to the metallized pads 22 on the bottom surface of the ceramic substrate so as to stand perpendicularly to the bottom surface of the ceramic substrate 10 in the form of a grid or a matrix.

As clearly shown in FIG. 2, each of the patterned metallized conductors is formed to extend from a periphery of the recess 12 (in the case of the third level patterned metallized conductors 16C) to the land 276 which is connected to the corresponding conducting through hole 24. Therefore, the patterned metallized conductors are formed to terminate at a substantial distance before a side surface of the ceramic substrate 10. In other words, each of the patterned metallized conductors has no "plating lead wire" which extends from the land to the side surface of the ceramic substrate 10 and which was formed in the prior art PGA semiconductor device package.

Figure 3:
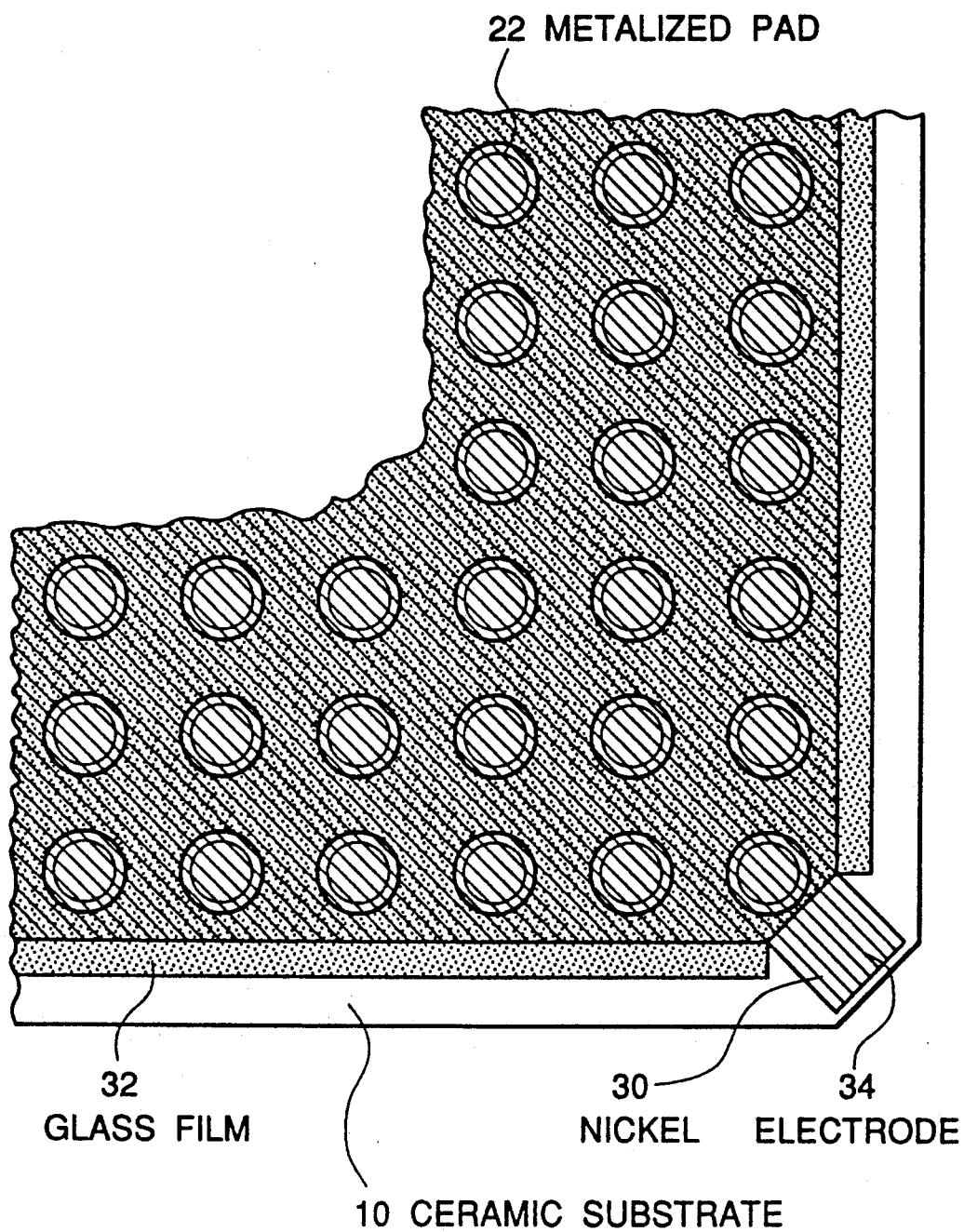
FIG. 3 is a diagrammatic plan view partially showing metallized pads of the ceramic substrate of the PGA type semiconductor device package in accordance with the present invention.

Now, an essential part of a process for manufacturing the embodiment of the PGA semiconductor device package in accordance with the present invention will be described with reference to FIGS. 3 and 4. FIG. 3 is a partial diagrammatic plan view illustrating a lead pin mounting surface of the ceramic substrate in the PGA semiconductor device package in accordance with the present invention, and FIG. 4 is an enlarged partial section view showing a base portion of the lead pin soldered on the ceramic substrate of the PGA type semiconductor device package in accordance with the present invention.

As shown in FIG. 3, a nickel film 30 is evaporated to cover a whole of a bottom surface of the ceramic substrate 10 (called a "lead pin mounting surface" of the ceramic substrate 10) including the metallized pads 22 formed on the lead pin mounting surface in the form of a matrix or a grid. As a result, the metallized pads 22 are short-circuited to one another by the nickel film 30. Then, a glass film 32 is deposited on the nickel film 30, excluding a region above each metallized pad 22 and a corner portion of the ceramic substrate 10. As seen from FIG. 3, a portion of the nickel film 30 uncovered with the glass film 32 in the corner portion of the ceramic substrate 10, will form an electrode 34 for electroplating.

Figure 4:
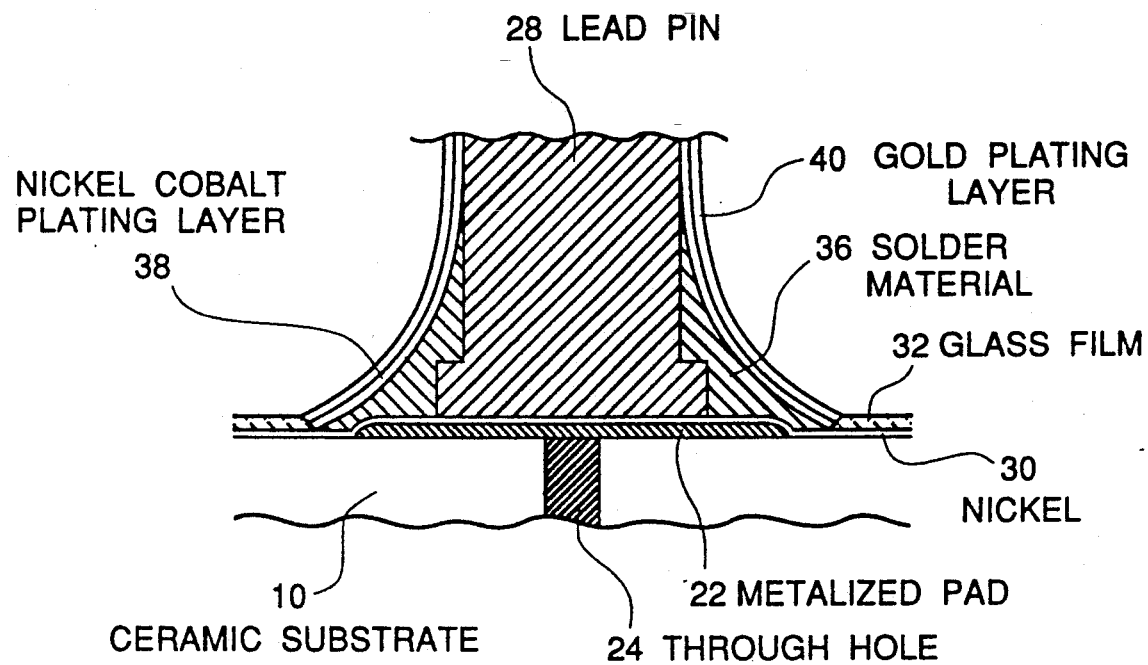
FIG. 4 is an enlarged partial sectional view of a base portion of the lead pin formed on the ceramic substrate of the PGA type semiconductor device package in accordance with the present invention.

Thereafter, as shown in FIG. 4, a lead pin 28, formed of for example "Kovar" or another material, is soldered to the nickel film portion 30 deposited on each metallized pad 22 and uncovered with the glass film 32, by using a solder material 36 such as a silver/copper solder material. Then, the substrate is immersed into an electroplating bath and a voltage is applied to the electrode 34 of the nickel film 30, so that a nickel/cobalt layer 38 and a gold layer 40 are deposited on the lead pins 28 and the deposited solder material 36 in the named order by means of the electroplating.

After the electroplating, the glass film 32 is removed by hydrofluoric acid, and the nickel film 30 is removed by a dilute hydrochloric acid. Thus, the PGA semiconductor device package is completed.

In the film removal process using the hydrofluoric acid and the dilute hydrochloric acid, each lead pin 28 and the applied solder material 36 are protected by the gold plating layer 40, and therefore, the characteristics of the PGA semiconductor device package is subjected to no adverse effect.

The invention has thus been shown and described with reference to the specific embodiments. However, it should be noted that the present invention is in no way limited to the details of the illustrated structures but changes and modifications may be made within the scope of the appended claims.

For example, a "plating lead wire" is provided in only a ground wiring pattern or a voltage supplying wiring pattern other than signal transferring wiring patterns, so that an electroplating is performed similarly to the above mentioned embodiment.

As seen from the above, according to the present invention, a metal film is evaporated on a lead pin mounting surface of the ceramic substrate, and is used as an electrode for the electroplating. With this feature, the "plating lead wire" formed by extending the metallized patterned conductors to the side surface of the ceramic substrate becomes unnecessary. Therefore, a stray capacitance between wiring conductors can be reduced, and accordingly, it is possible to suppress the signal crosstalk or the noise generation in a high frequency operation of the integrated circuit.

I claim:

1. A method for manufacturing a pin grid array type semiconductor device package which includes a substrate having a principal surface and a bottom surface opposing the principal surface, the principal surface having a region on which a semiconductor device chip is to be mounted, a plurality of patterned metallized conductors formed in the substrate or on the principal surface of the substrate so as to be electrically connected to the semiconductor device chip, a plurality of metallized pads formed on the bottom surface and electrically connected to the patterned metallized conductors, the method including the step of depositing a metal film so as to cover the bottom surface including the metallized pads, and electroplating the lead pin by applying a voltage to the metal film.

2. A method claimed in claim 1 further including the step of, before the fixing of the lead pin, depositing a glass film on the metal film excluding regions above the metallized pads and a corner of the substrate, and fixing the lead pin on the metal film uncovered by the glass film.

3. A method claimed in claim 2 wherein the application of the voltage is performed by applying a voltage to the metal film uncovered by the glass film in the corner of the substrate.

4. A method claimed in claim 3 wherein the lead pin is fixed by soldering the lead pin to the metal film uncovered by the glass film and positioned on each metallized pad, by applying a solder material, and wherein the electroplating includes an electroplating of a first metal film on the lead pin and the solder material applied to the lead pin, and an electroplating of a second metal film of gold on the first metal film.

5. A method claimed in claim 4 further including the steps of, after the electroplating, removing the glass film by hydrofluoric acid, and then removing the metal film by a dilute hydrochloric acid, by using the second metal film of gold as a protection film.

* * * * *